(12) United States Patent
Bai et al.

(10) Patent No.: US 11,822,854 B2
(45) Date of Patent: Nov. 21, 2023

(54) AUTOMATIC VOLUME ADJUSTMENT METHOD AND APPARATUS, MEDIUM, AND DEVICE

(71) Applicant: Beijing Bytedance Network Technology Co., Ltd., Beijing (CN)

(72) Inventors: Hequn Bai, Beijing (CN); Chuxiang Shang, Beijing (CN)

(73) Assignee: BEIJING BYTEDANCE NETWORK TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/820,472

(22) Filed: Aug. 17, 2022

(65) Prior Publication Data
US 2022/0391163 A1    Dec. 8, 2022

Related U.S. Application Data

(63) Continuation of application No. PCT/CN2021/080304, filed on Mar. 11, 2021.

(30) Foreign Application Priority Data

Apr. 7, 2020  (CN) .......................... 202010266544.8

(51) Int. Cl.
*H03G 3/32* (2006.01)
*G06F 3/16* (2006.01)
*H04R 3/00* (2006.01)

(52) U.S. Cl.
CPC ............... *G06F 3/16* (2013.01); *H04R 3/00* (2013.01); *H03G 3/32* (2013.01); *H04R 2430/01* (2013.01)

(58) Field of Classification Search
CPC ........ H04R 3/00; H04R 2430/01; H03G 3/32; H03G 3/24; G06F 3/16
(Continued)

(56) References Cited

U.S. PATENT DOCUMENTS 11,295,718 B2 *  4/2022  Trivedi .................... H04R 3/00
11,488,591 B1 * 11/2022  Hart ......................... H03G 5/02
(Continued)

FOREIGN PATENT DOCUMENTS

CN      104427083 A      3/2015
CN      105791530 A      7/2016
(Continued)

OTHER PUBLICATIONS

International Search Report and Written Opinion for International Patent Application No. PCT/CN2021/080304, dated May 28, 2021 (12 pages).
(Continued)

*Primary Examiner* — Disler Paul
(74) *Attorney, Agent, or Firm* — ARENTFOX SCHIFF LLP

(57) ABSTRACT

The present disclosure relates to an automatic volume adjustment method and apparatus, a medium, and a device, which belong to the field of computer technologies, and can adjust the playback volume of audio or video. The automatic volume adjustment method includes: acquiring, in a case that a terminal does not output loudspeaker sound, a noise signal outside the terminal; determining noise energy based on the noise signal; and adjusting playback volume of audio or video on the terminal based on the noise energy.

9 Claims, 2 Drawing Sheets

(58) Field of Classification Search
USPC .................................... 381/56–57, 104–109
See application file for complete search history.

(56) References Cited

U.S. PATENT DOCUMENTS

| | | |
|---|---|---|
| 2003/0123680 A1 | 7/2003 | Lee et al. |
| 2007/0126503 A1 | 6/2007 | Hsieh et al. |
| 2009/0022329 A1 | 1/2009 | Mahowald |
| 2010/0146445 A1 | 6/2010 | Kraut |

FOREIGN PATENT DOCUMENTS

| | | |
|---|---|---|
| CN | 106161781 A | 11/2016 |
| CN | 107124149 4 | 9/2017 |
| CN | 108831498 A | 11/2018 |
| CN | 108845787 A | 11/2018 |
| KR | 20100073737 A | 7/2010 |
| WO | 2019033940 A1 | 2/2019 |

OTHER PUBLICATIONS

Decision on Rejection for Chinese Patent Application No. 2020102665448, dated Jul. 15, 2022 (5 pages).
First Office Action for Chinese Patent Application No. 2020102665448, dated Oct. 29, 2021 (12 pages).
Second Office Action for Chinese Patent Application No. 2020102665448, dated Apr. 13, 2022 (10 pages).
Examination Report for Indian Patent Application No. 202227056774, dated Dec. 20, 2022 (6 pages).
Extended European Search Report for EP Patent Application No. 21785113.8, dated Aug. 18, 2023 (8 pages).

\* cited by examiner

US 11,822,854 B2

AUTOMATIC VOLUME ADJUSTMENT METHOD AND APPARATUS, MEDIUM, AND DEVICE

CROSS-REFERENCE TO RELATED APPLICATIONS

The present application is a continuation of International Application No. PCT/CN2021/080304, filed on Mar. 11, 2021, which claims priority to Chinese Patent Application No. 202010266544.8, titled "AUTOMATIC VOLUME ADJUSTMENT METHOD AND APPARATUS, MEDIUM, AND DEVICE", filed on Apr. 7, 2020. The disclosures of the above applications are hereby incorporated by reference in their entireties.

TECHNICAL FIELD

The present disclosure relates to the field of computer technologies and, in particular, to an automatic volume adjustment method and apparatus, a medium, and a device.

BACKGROUND

At present, when a user uses a handheld terminal (such as a mobile phone, a tablet computer, etc.) to play audio or video, the user usually manually sets playback volume that he/she considers comfortable. When the environment changes, such as entering a noisy subway, the original playback volume is not loud enough for the user to hear the content clearly due to the interference of environmental noise, and the user needs to manually increase the playback volume again. If the environment changes frequently, the user needs to adjust the playback volume frequently.

SUMMARY

The summary is provided to introduce concepts in a simplified form that are described in detail in the description of embodiments that follows. The summary is not intended to identify key features or essential features of the claimed technical solution, nor is it intended to be used to limit the scope of the claimed technical solution.

In a first aspect, the present disclosure provides an automatic volume adjustment method, including: acquiring, in a case that a terminal does not output loudspeaker sound, a noise signal outside the terminal; determining noise energy based on the noise signal; and adjusting playback volume of audio or video on the terminal based on the noise energy.

In a second aspect, the present disclosure provides an automatic volume adjustment apparatus, including: a noise signal acquiring module, configured to acquire, in a case that a terminal does not output loudspeaker sound, a noise signal outside the terminal; a noise energy determining module, configured to determine noise energy based on the noise signal; and a volume adjusting module, configured to adjust playback volume of audio or video based on the noise energy.

In a third aspect, the present disclosure provides a computer-readable medium, on which a computer program is stored, where when the computer program is executed by a processing apparatus, the steps of the method according to the first aspect of the present disclosure are implemented.

In a fourth aspect, the present disclosure provides an electronic device, including: a storage apparatus, on which a computer program is stored; and a processing apparatus, configured to execute a computer program stored in the storage apparatus to implement the steps of the method according to the first aspect of the present disclosure.

In a fifth aspect, the present disclosure provides a computer program product, including a computer program carried on a computer-readable medium, where the computer program, when executed by a processor, implements the steps of the method according to the first aspect of the present disclosure.

In a sixth aspect, the present disclosure provides a computer program, and when the computer program runs on an electronic device, the electronic device is caused to implement the steps of the method according to the first aspect of the present disclosure.

By adopting the above technical solution, since the noise signal outside the terminal can be acquired in a case that the terminal does not output loudspeaker sound, then the noise energy can be determined based on the noise signal, and then the playback volume of the audio or the video on the terminal can be adjusted based on the noise energy, the automatic adjustment of the playback volume can thus be realized to avoid the user manually adjusting the playback volume, and the interference of the sound played by the terminal per se to the noise of the terminal's the external environment per se can be eliminated in the process of automatically adjusting the playback volume, so that the automatic adjustment of the playback volume can be based only on the noise of the terminal's the external environment per se and thus be more accurate.

Other features and advantages of the present disclosure will be described in detail in the description of embodiments that follows.

BRIEF DESCRIPTION OF DRAWINGS

The above and other features, advantages, and aspects of the embodiments of the present disclosure will become more apparent in combination with the accompanying drawings and with reference to the following description of embodiments. Throughout the accompanying drawings, identical or similar reference numbers represent identical or similar elements. It should be understood that the accompanying drawings are illustrative, and components and elements are not necessarily drawn to scale. In the accompanying drawings.

DESCRIPTION OF EMBODIMENTS

The embodiments of the present disclosure will be described in more detail below with reference to the accompanying drawings. Although some embodiments of the present disclosure are shown in the accompanying drawings, it should be understood that the present disclosure may be implemented in various forms and should not be construed as being limited to the embodiments set forth herein. On the contrary, these embodiments are provided for a more thorough and complete understanding of the present disclosure. It should be understood that the accompanying drawings and embodiments of the present disclosure are merely for illustrative purposes, and are not intended to limit the protection scope of the present disclosure.

It should be understood that the steps described in the method implementations of the present disclosure may be performed in different orders, and/or performed in parallel. Furthermore, the method implementations may include additional steps and/or omit to perform the illustrated steps. The scope of the present disclosure is not limited in this regard.

As used herein, the term "including" and variants thereof are open-ended inclusions, i.e., "including but not limited to". The term "based on" is "at least partly based on". The term "an embodiment" means "at least one embodiment"; the term "another embodiment" means "at least one other embodiment"; the term "some embodiments" means "at least some embodiments". Relevant definitions of other terms will be given in the description below.

It should be noted that concepts such as "first" and "second" mentioned in the present disclosure are merely used to distinguish different apparatuses, modules, or units, and are not used to limit the order or interdependencies of functions performed by these apparatuses, modules or units.

It should be noted that the modifications of "one" and "a plurality of" mentioned in the present disclosure are illustrative rather than restrictive, and those skilled in the art should understand that they should be understood as "one or a plurality of" unless otherwise expressly stated in the context.

The names of messages or information exchanged between a plurality of apparatuses in the implementations of the present disclosure are merely for illustrative purposes, and are not intended to limit the scope of these messages or information.

The inventors of the present disclosure found that when audio or video is played using a loudspeaker, the sound outside the terminal includes not only the sound of the external environment of the terminal but also the sound of the audio or the video played by the terminal per se.

Figure 1:
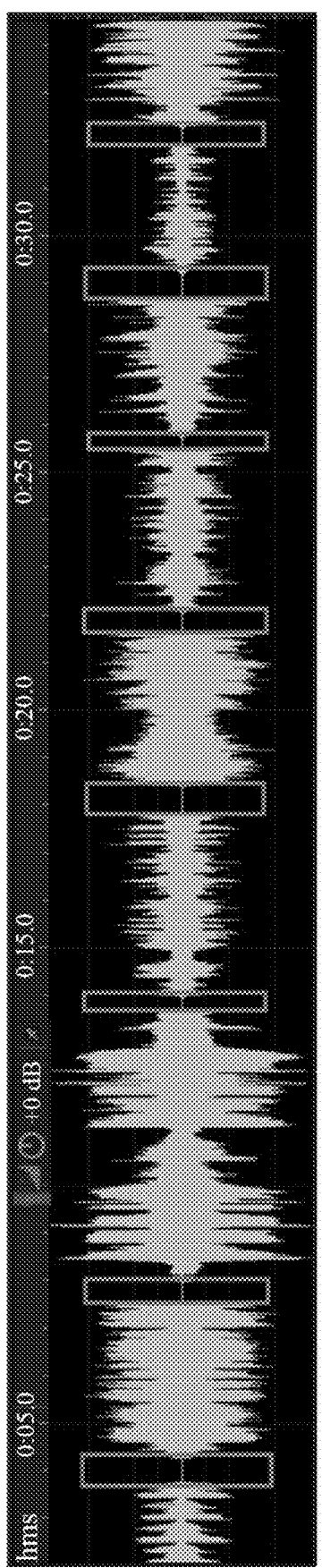
FIG. 1 is an illustrative schematic diagram where a terminal does not output loudspeaker sound in a case that audio or video is played through a loudspeaker.

The inventors of the present disclosure also found that when users play audio or video using a loudspeaker, they usually have actions such as turning a page, sliding up the screen, switching to a next piece of audio or video, pausing the playback of audio or video, and so on. During these actions, the terminal does not play any audio or video. For example, the duration of the action of turning a page is about several seconds to more than ten seconds. During this time period, the terminal does not play any audio or video. In the present disclosure, those cases described above are collectively referred to as a case that the terminal does not output loudspeaker sound, and the durations of the actions described above are collectively referred to as the interval of audio or video switching. FIG. 1 is an illustrative schematic diagram where a terminal does not output loudspeaker sound in a case that audio or video is played through a loudspeaker. The positions marked by the blocks in FIG. 1 correspond to the time periods when the terminal does not output loudspeaker sound.

The inventors of the present disclosure also found that if a noise signal outside a terminal can be collected during the time period that the terminal does not output loudspeaker sound in a case that audio or video is played through a loudspeaker, the interference of the sound played by the terminal per se to the noise signal of the terminal's the external environment per se can then be eliminated, and thus only the noise signal of the terminal's the external environment per se is collected, and then only the noise energy of the external environment of the terminal can be obtained.

Figure 2:
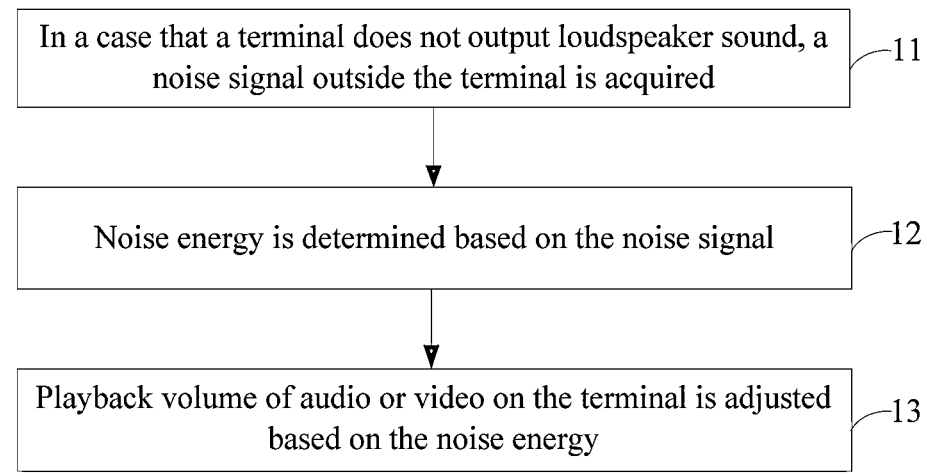
FIG. 2 is a flowchart of an automatic volume adjustment method according to an embodiment of the present disclosure.

FIG. 2 is a flowchart of an automatic volume adjustment method according to an embodiment of the present disclosure. As shown in FIG. 2, the automatic volume adjustment method may include the following steps S11 to S13.

In step S11, in a case that a terminal does not output loudspeaker sound, a noise signal outside the terminal is acquired.

The terminal may be a handheld terminal such as a mobile phone or a tablet computer, or may be a terminal such as a smart TV, or may be a smart audio playing terminal such as a Xiaodu smart speaker.

In an implementation, whether the terminal is currently in a time period that the terminal does not output loudspeaker sound can be determined through an application on the terminal returning a current playback state in real-time.

In an implementation, the noise signal outside the terminal may be acquired by using a built-in microphone of the terminal.

In step S12, noise energy is determined based on the noise signal.

In step S13, playback volume of audio or video on the terminal is adjusted based on the noise energy.

By adopting the above technical solution, since the noise signal outside the terminal can be acquired in a case that the terminal does not output loudspeaker sound, then the noise energy can be determined based on the noise signal, and then the playback volume of the audio or the video on the terminal can be adjusted based on the noise energy, the automatic adjustment of the playback volume can thus be realized to avoid the user manually adjusting the playback volume, and the interference of the sound played by the terminal per se to the noise of the terminal's the external environment per se can be eliminated in the process of automatically adjusting the playback volume, so that the automatic adjustment of the playback volume can be based only on the noise of the terminal's the external environment per se and thus be more accurate.

In an embodiment, the determination of the noise energy based on the noise signal in step S12 may be implemented in multiple ways, and only some implementations thereof are given in the following.

A first implementation may include determining signal energy of a frame of signal last acquired in the noise signal as the noise energy, where the duration of each frame of signal may be set according to actual conditions, for example, may be set to 10 ms, 8 ms, 15 ms, etc., which is not limited in the present disclosure. The calculation method of the signal energy of the noise signal maybe to calculate by adopting an existing calculation method of signal energy, which is not limited in the present disclosure. By adopting this implementation, the current noise energy of the external environment of the terminal can be determined.

A second implementation can be described as follows.

Firstly, smoothing processing is performed on signal energy of previous N frames of signal in the noise signal to obtain smoothed energy of the previous N frames of signal; the previous N frames of signal are N frames of signal before the frame of signal last acquired in the noise signal, and N is a positive integer greater than or equal to 1. As mentioned above, the duration of each frame of signal may be set according to actual conditions, which is not limited in the present disclosure. The calculation method of the signal energy of each frame of signal may be to calculate by adopting an existing calculation method of signal energy, which is also not limited in the present disclosure.

Then, smoothing processing is performed on signal energy of the last acquired frame of signal based on the smoothed energy of the previous N frames of signal and the signal energy of the last acquired frame of signal, to obtain smoothed energy of the last acquired frame of signal. For example, the smoothing processing can be implemented using the following formula:

$$E\_smoothed(t)=a1*E\_smoothed(t-1)+a2*E\_smoothed(t-2)+\ldots+aN*E\_smoothed(t-N)+b1*E(t)$$

where, E_smoothed(t) represents the smoothed energy of the last acquired frame of signal; E_smoothed(t−1), E_smoothed(t−2), . . . , E_smoothed(t−N) represent the smoothed energy of the previous N frames of signal respectively; E(t) represents the signal energy of the last acquired frame of signal; a1, a2, . . . , aN, b1 represent coefficients, and the sum of these coefficients is equal to 1; and t represents time.

An example is taken where N equal to 1, then E_smoothed(t)=a1*E_smoothed(t−1)+b1*E(t), where the value of a1 may be 0.70.95, for example, the value may be 0.9, and the value of b1 may be 0.05~0.3, for example, the value may be 0.1.

Finally, the smoothed energy of the last acquired frame of signal, i.e., E_smoothed(t), is determined as the noise energy.

By adopting the above implementations, through performing smoothing processing on the signal energy of the last acquired frame of signal based on the smoothed energy of the previous N frames of signal and the signal energy of the last acquired frame of signal, the detected noise energy of the external environment of the terminal can be relatively smooth, and then the adjustment of the playback volume is also relatively smooth, which avoids a substantial increase or decrease of the playback volume, thereby bringing a better user experience to a user.

A third implementation can be described as follows.

First, smoothing processing is performed on signal energy of previous N frames of signal in the noise signal to obtain smoothed energy of the previous N frames of signal; where the previous N frames of signal are N frames of signal before the frame of signal last acquired in the noise signal, and N is a positive integer greater than or equal to 1. As mentioned above, the duration of each frame of signal may be set according to actual conditions, which is not limited in the present disclosure. The calculation method of the signal energy of each frame of noise signal may be to calculate by adopting an existing calculation method of signal energy, which is also not limited in the present disclosure.

Then, smoothing processing is performed on signal energy of the last acquired frame of signal based on the smoothed energy of the previous N frames of signal and the signal energy of the last acquired frame of signal to obtain smoothed energy of the last acquired frame of signal.

For example, the smoothing processing can be implemented using the following formula:

$$E\_smoothed(t)=a1*E\_smoothed(t-1)+a2*E\_smoothed(t-2)+\ldots+aN*E\_smoothed(t-N)+b1*E(t)$$

where, E_smoothed(t) represents the smoothed energy of the last acquired frame of signal; E_smoothed(t−1), E_smoothed(t−2), E_smoothed(t−N) represent the smoothed energy of the previous N frames of signal respectively; E(t) represents the signal energy of the last acquired frame of signal; a1, a2, . . . , aN, b1 represent coefficients, and the sum of these coefficients is equal to 1; and t represents time.

An example is taken where N equal to 1, then E_smoothed(t)=a1*E_smoothed(t−1)+b1*E(t), where the value of a1 may be 0.7~0.95, for example, the value may be 0.9, and the value of b1 may be 0.05~0.3, for example, the value may be 0.1.

Then, the smoothed energy of the last acquired frame of signal, i.e., E_Smoothed(t), is compared with previously updated noise energy $N_{previously\ updated\ noise\ energy}$.

In the case of performing processing on a first frame of the noise signal, the smoothed energy E_smoothed(1) of the first frame of the noise signal may be compared with the preset initial noise energy $N_{preset\ initial\ noise\ energy}$. The preset initial noise energy $N_{preset\ initial\ noise\ energy}$ is typically set to a value representing a relatively quiet environment. For example, the value of the preset initial noise energy $N_{preset\ initial\ noise\ energy}$ may be within the range of −120 dBFS~170 dBFS, for example, may be set to be −96 dBFS.

Finally, the previously updated noise energy is updated based on the comparison result to obtain updated noise energy.

In a case where the smoothed energy E_smoothed(t) of the frame of signal last acquired is less than the previously updated noise energy $N_{previously\ updated\ noise\ energy}$, the previously updated noise energy $N_{previously\ updated\ noise\ energy}$ is updated by using the following formula:

$$N_{updated\ noise\ energy}=(a*E\_smoothed(t)+b*N_{previously\ updated\ noise\ energy})*c$$

In a case where the smoothed energy E_smoothed(t) of the frame of signal last acquired is greater than the previously updated noise energy $N_{previously\ updated\ noise\ energy}$, the previously updated noise energy $N_{previously\ updated\ noise\ energy}$ is updated by using the following formula:

$$N_{updated\ noise\ energy}=N_{previously\ updated\ noise\ energy}*d$$

where $N_{updated\ noise\ energy}$ represents the updated noise energy, i.e., the current noise energy outside the terminal; a, b, c and d are coefficients, and the sum of the coefficients a and b is equal to 1, and the coefficients c and d may be within the range of 1~1.1, for example, both c and d may be set to 1.0002; and t represents time.

By adopting the above implementation method, smooth automatic adjustment of the playback volume can be realized to avoid sudden and large increase or decrease of the playback volume. For example, assuming that a user suddenly enters a very noisy environment from a very quiet environment and starts TikTok to start watching a short video, in this case, the smoothed energy E_smoothed(t) of the frame of signal last acquired is bound to be much greater than the preset initial noise energy $N_{preset\ initial\ noise\ energy}$. At this time, since E_smoothed(t)>$N_{preset\ initial\ noise\ energy}$, N preset initial noise energy is updated by using the above formula $N_{updated\ noise\ energy}=N_{previously\ updated\ noise\ energy}*d$ (in the case of performing processing on the first frame of the noise signal, $N_{previously\ updated\ noise\ energy}$ is $N_{preset\ initial\ noise\ energy}$), and then for the next frame, since E_smoothed(t) is still greater than $N_{previously\ updated\ noise\ energy}$, N previously updated noise energy may be updated through continuing to use the above formula $N_{updated\ noise\ energy}=N_{previously\ updated\ noise\ energy}*d$ according to the method of the present disclosure. Such repetition will gradually make $N_{updated}$ noise energy approximate E_smoothed(t). Furthermore, since the playback volume is adjusted based on the noise energy $N_{updated\ noise\ energy}$ of the terminal's the external environment per se, the smooth automatic adjustment of the playback volume is realized by the method according to the present disclosure.

In an embodiment, the adjustment of the playback volume of audio or video based on the noise energy described in step S13 may also be implemented in multiple ways. An implementation may be to determine target volume corresponding to the noise energy by using a preset correspondence table, and then determine the playback volume of the audio or the video based on the target volume. Another implementation may be to calculate target volume corresponding to the noise energy by using a preset functional relationship, where the target volume and the noise energy satisfy the preset functional relationship, and then determine the playback volume of the audio or video based on the target volume. The preset correspondence table, the preset functional relationship, etc. may be obtained through experiments. For example, the playback volume of browsing video or listening to audio by a user in different noise environments may be pre-collected, and then the playback volume and the ambient noise are taken as samples for training, or an average, a root mean square or the like may be taken for the playback volume in the same noise environment, so as to obtain a preset correspondence between the playback volume and the ambient noise. When adjusting the playback volume, the playback volume can be automatically adjusted based on these preset correspondences, so that the playback volume can be automatically increased in a noisy environment, and the playback volume can be automatically reduced in a quiet environment, so that the user can maintain a comfortable listening experience in different environments.

In an implementation, since the noise signal of the external environment of the terminal is continuously collected during the time period that the terminal does not output loudspeaker sound, the adjustment of the playback volume can also be continuously performed during the period that the terminal does not output loudspeaker sound. Of course, it is also feasible to adjust the playback volume only at the end of the time period that the terminal does not output loudspeaker sound, that is, when the time period that the terminal does not output loudspeaker sound lasts but has not ended, the noise energy outside the terminal is continuously determined by adopting the implementations described above, but the playback volume is not be adjusted, and then the playback volume is adjusted based on the determined current ambient noise energy only at the end of the time period, which can save the resource occupation of the terminal.

In an implementation, the automatic volume adjustment method according to the embodiments of the present disclosure may be executed continuously while a user is browsing videos or listening to audios. For example, if a user walks from a quiet home to a noisy street, and has been watching a short video during the process, the automatic volume adjustment method according to the embodiments of the present disclosure is also continuously executed during this time period. For another example, if a user watches a short video through a terminal application at home, and then closes the terminal application, and then opens the terminal application again on a noisy street to watch a short video, the automatic volume adjustment method according to the embodiments of the present disclosure is also continuously executed respectively when the user opens the terminal application twice to watch short videos.

Figure 3:
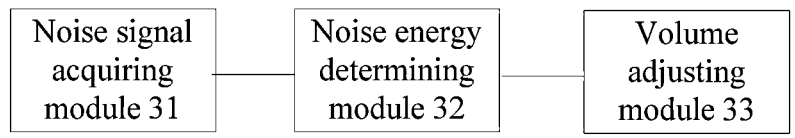
FIG. 3 is a schematic block diagram of an automatic volume adjustment apparatus according to an embodiment of the present disclosure.

FIG. 3 is a schematic block diagram of an automatic volume adjustment apparatus according to an embodiment of the present disclosure. As shown in FIG. 3, the automatic volume adjustment apparatus includes: a noise signal acquiring module 31, configured to acquire, in a case that a terminal does not output loudspeaker sound, a noise signal outside the terminal; a noise energy determining module 32, configured to determine noise energy based on the noise signal; and a volume adjusting module 33, configured to adjust playback volume of audio or video based on the noise energy.

By adopting the above technical scheme, since the noise signal outside the terminal can be acquired in a case that the terminal does not output loudspeaker sound, then the noise energy can be determined based on the noise signal, and then the playback volume of the audio or the video on the terminal can be adjusted based on the noise energy, the automatic adjustment of the playback volume can thus be realized to avoid a user manually adjusting the playback volume, and the interference of the sound played by the terminal per se to the noise of the terminal's the external environment per se can be eliminated in the process of automatically adjusting the playback volume, so that the automatic adjustment of the playback volume can be based only on the noise of the terminal's the external environment per se and thus be more accurate.

Optionally, the noise energy determining module 32 is configured to: determine signal energy of a last acquired frame of signal in the noise signal as the noise energy.

Optionally, the noise energy determining module 32 is configured to: perform smoothing processing on signal energy of previous N frames of signal in the noise signal to obtain smoothed energy of the previous N frames of signal; where the previous N frames of signal are N frames of signal before the last acquired frame of signal in the noise signal, and N is a positive integer greater than or equal to 1; perform smoothing processing on signal energy of the last acquired frame of signal based on the smoothed energy of the previous N frames of signal and the signal energy of the last acquired frame of signal to obtain smoothed energy of the last acquired frame of signal; and determine the smoothed energy of the last acquired frame of signal as the noise energy.

Optionally, the noise energy determining module 32 is configured to: perform smoothing processing on signal energy of previous N frames of signal in the noise signal to obtain smoothed energy of the previous N frames of signal; where the previous N frames of signal are N frames of signal before the last acquired frame of signal in the noise signal, and N is a positive integer greater than or equal to 1; perform smoothing processing on signal energy of the last acquired frame of signal based on the smoothed energy of the previous N frames of signal and the signal energy of the last acquired frame of signal to obtain smoothed energy of the last acquired frame of signal; compare the smoothed energy of the last acquired frame of signal with previously updated noise energy; and update the previously updated noise energy based on a comparison result to obtain updated noise energy.

Optionally, the noise energy determining module 32 is configured to:
in a case that the smoothed energy of the last acquired frame of signal is less than the previously updated noise energy, update the previously updated noise energy by the following formula:

$$N_{updated\ noise\ energy} = (a * E\_smoothed(t) + b * N_{previously\ updated\ noise\ energy}) * c$$

in a case that the smoothed energy of the last acquired frame of signal is greater than the previously updated noise energy, update the previously updated noise energy by the following formula:

$$N_{updated\ noise\ energy} = N_{previously\ updated\ noise\ energy} * d$$

where $N_{updated\ noise\ energy}$ represents the updated noise energy; E_smoothed(t) represents the smoothed energy of the last acquired frame of signal; $N_{previously\ updated\ noise\ energy}$ represents the previously updated noise energy; a, b, c, and d are coefficients; and t represents time.

Optionally, the volume adjusting module 33 is configured to: determine target volume corresponding to the noise energy by using a preset correspondence table; and determine the playback volume of the audio or the video based on the target volume.

Optionally, the volume adjusting module 33 is configured to: calculate target volume corresponding to the noise energy by using a preset functional relationship, where the target volume and the noise energy satisfy the preset functional relationship; and determine the playback volume of the audio or the video based on the target volume.

The specific implementations of the operations performed by respective modules in the automatic volume adjustment apparatus according to the embodiments of the present disclosure have been described in detail in the related methods, which will not be repeated here.

Figure 4:
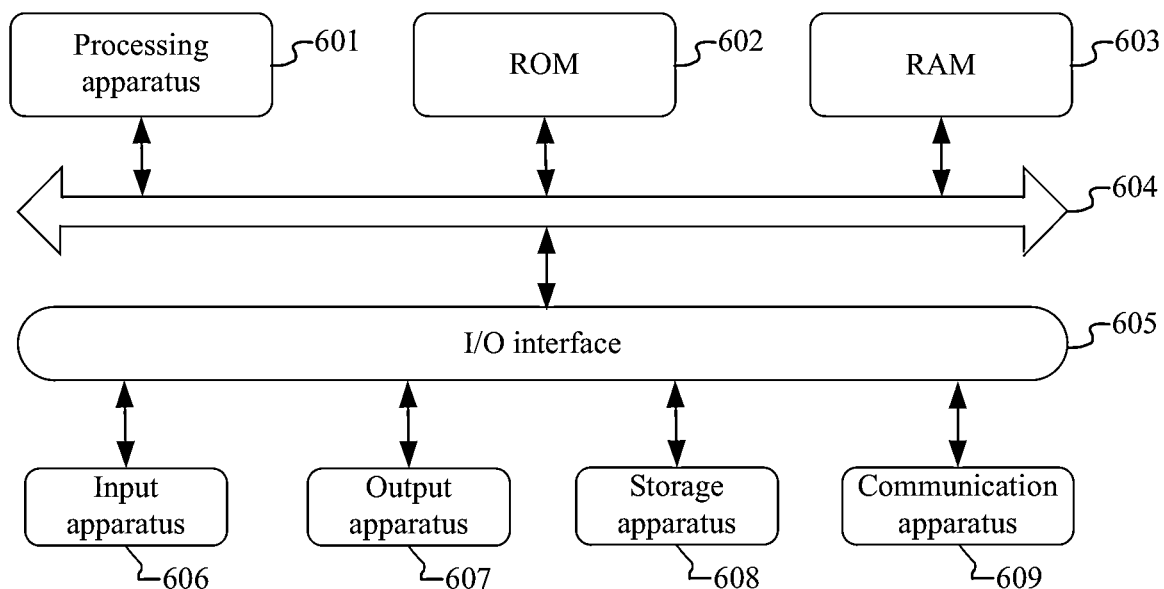
FIG. 4 is a schematic structural diagram of an electronic device according to an embodiment of the present disclosure.

Reference is made to FIG. 4 below, which shows a schematic structural diagram of an electronic device 600 suitable for implementing an embodiment of the present disclosure. The terminal device in the embodiment of the present disclosure may include, but is not limited to, a mobile terminal such as a mobile phone, a laptop, a digital broadcast receiver, a PDA (personal digital assistant), a PAD (portable android device), a PMP (portable media player), a vehicle-mounted terminal (e.g., a vehicle-mounted navigation terminal) or the like, and a fixed terminal such as a digital TV, a desktop computer or the like. The electronic device shown in FIG. 4 is merely an example, and should not impose any restrictions on the function and the range of use of the embodiments of the present disclosure.

As shown in FIG. 4, the electronic device 600 may include a processing apparatus (such as a central processor, a graphics processor and etc.) 601, which may perform various appropriate actions and processing according to a program stored in a read only memory (ROM) 602 or a program loaded from a storage apparatus 608 to a random access memory (RAM) 603. In the RAM 603, various programs and data required for the operation of the electronic device 600 are also stored. The processing apparatus 601, the ROM 602, and the RAM 603 are connected with each other through a bus 604. An input/output (I/O) interface 605 is also connected to the bus 604.

Generally, the following apparatuses may be connected to the I/O interface 605: an input apparatus 606, including, for example, a touch screen, a touch panel, a keyboard, a mouse, a camera, a microphone, an accelerometer, a gyroscope, and the like; an output apparatus 607, including, for example, a liquid crystal display (LCD), a speaker, a vibrator, and the like; a storage apparatus 608, including, for example, a magnetic tape, a hard disk, and the like; and a communication apparatus 609. The communication apparatus 609 may allow the electronic device 600 to perform wireless or wired communication with other devices to exchange data. Although FIG. 4 shows the electronic device 600 with multiple kinds of apparatuses, it should be understood that it is not required to implement or have all the apparatuses shown, and alternatively, it is possible to implement or provide more or fewer apparatuses.

In particular, according to embodiments of the present disclosure, the process described above with reference to the flowchart may be implemented as a computer software program. For example, an embodiment of the present disclosure includes a computer program product, which includes a computer program carried on a non-transitory computer readable medium. The computer program contains program code for executing the method shown in the flowcharts. In such an embodiment, the computer program may be downloaded from a network through the communication apparatus 609 and installed, or installed from the storage apparatus 608, or installed from the ROM 602. When the computer program is executed by the processing apparatus 601, the above-mentioned functions defined in methods of embodiments of the present disclosure are executed. The embodiments of the present disclosure also include a computer program, when the computer program runs on the electronic device, the above-described functions defined in the methods of some embodiments of the present disclosure are performed.

It should be noted that, the above-mentioned computer readable medium in the present disclosure may be a computer readable signal medium, or a computer readable storage medium, or any combination of the both. The computer readable storage medium may be, for example, but not limited to, an electrical, magnetic, optical, electromagnetic, infrared, or semiconductor system, apparatus or device, or any combination of the above. A more specific example of the computer readable storage medium may include, but is not limited to: an electrical connection with one or more wires, a portable computer disk, a hard disk, a random access memory (RAM), a read only memory (ROM), an erasable programmable read only memory (EPROM or a flash), an optical fiber, a portable compact disc read only memory (CD-ROM), an optical storage device, a magnetic storage device, or any suitable combination of the above. In the present disclosure, the computer readable storage medium may be a tangible medium that contains or stores a program, and the program may be used by or in combination with an instruction execution system, apparatus, or device. In the present disclosure, a computer readable signal medium may include a data signal propagated in a baseband or propagated as a part of a carrier wave, and computer readable program code is carried therein. This propagated data signal may adopt many forms, including but not limited to, an electromagnetic signal, an optical signal, or any suitable combination of the above. The computer readable signal medium may also be any computer readable medium other than the computer readable storage medium, and the computer readable signal medium may send, propagate, or transmit the program used by or in combination with the instruction execution system, apparatus, or device. The program code contained on the computer readable medium may be transmitted by any suitable medium, including but not limited to: a wire, an optical cable, RF (Radio Frequency), etc., or any suitable combination of the above.

In some implementations, a client and a server can communicate using any currently known network protocol such as HTTP (hypertext transfer protocol) or future developed network protocol, and can be interconnected with digital data communication of any form or medium (e.g., a communication network). Examples of the communication network include a local area network ("LAN"), a wide area network ("WAN"), an inter-network (e.g., the Internet), and a peer-to-peer network (e.g., an ad hoc peer-to-peer network), as well as any currently known or future developed network.

The above-mentioned computer readable medium may be included in the above-mentioned electronic device, or may exist alone without being assembled into the electronic device.

The above-mentioned computer readable medium carries thereon one or more programs which, when executed by the electronic device, cause the electronic device to: in a case that a terminal does not output loudspeaker sound, acquire a noise signal outside the terminal; determine noise energy based on the noise signal; and adjust playback volume of audio or video on the terminal based on the noise energy.

Computer program code used to perform operations of the present disclosure may be written in one or more programming languages or a combination thereof. The above-mentioned programming languages include, but is not limited to, an object-oriented programming language, such as Java, Smalltalk, C++, and also include a conventional procedural programming language, such as "C" language or similar programming language. Program code may be executed entirely on a computer of a user, partly on a computer of a user, executed as an independent software package, partly executed on a computer of a user and partly executed on a remote computer, or entirely executed on a remote computer or a server. In a case where a remote computer is involved, the remote computer may be connected to the computer of the user through any kind of network including a local area network (LAN) or a wide area network (WAN), or, may be connected to an external computer (for example, connected via the Internet utilizing an Internet service provider).

The flowcharts and block diagrams in the accompanying drawings illustrate system architectures, functions, and operations of possible implementations of the system, method, and computer program product in accordance with various embodiments of the present disclosure. In this point, each block in the flowcharts or block diagrams may represent a module, a program segment, or a part of code, and the module, the program segment, or the part of code contains one or more executable instructions for implementing a designated logical function. It should also be noted that, in some alternative implementations, the functions marked in the blocks may also occur in a different order from the order marked in the drawings. For example, two blocks shown one after another may actually be executed substantially in parallel, or sometimes may be executed in a reverse order, which depends on the functions involved. It should also be noted that, each block in the block diagrams and/or flowcharts, and a combination of blocks in the block diagrams and/or flowcharts, may be implemented by a dedicated hardware-based system that performs designated functions or operations, or may be implemented by a combination of dedicated hardware and computer instructions.

The modules involved in the description of the embodiments of the present disclosure may be implemented in software or hardware, where a name of a module does not constitute a limitation on the module itself in a certain case.

The functions described above herein may be performed at least in part by one or more hardware logic components. For example, non-restrictively, exemplary types of hardware logic components that may be used include: a field programmable gate array (FPGA), an application specific integrated circuit (ASIC), an application specific standard product (ASSP), a system on chip (SOC), a complex programmable logic device (CPLD), and the like.

According to one or a plurality of embodiments of the present disclosure, example 1 provides an automatic volume adjustment method, including: acquiring, in a case that a terminal does not output loudspeaker sound, a noise signal outside the terminal; determining noise energy based on the noise signal; and adjusting playback volume of audio or video on the terminal based on the noise energy.

According to one or a plurality of embodiments of the present disclosure, example 2 provides the method of example 1, further including: determining signal energy of a last acquired frame of signal in the noise signal as the noise energy.

According to one or a plurality of embodiments of the present disclosure, example 3 provides the method of example 1, further including: performing smoothing processing on signal energy of previous N frames of signal in the noise signal to obtain smoothed energy of the previous N frames of signal; where the previous N frames of signal are N frames of signal before the last acquired frame of signal in the noise signal, and N is a positive integer greater than or equal to 1; performing smoothing processing on signal energy of the last acquired frame of signal based on the smoothed energy of the previous N frames of signal and the signal energy of the last acquired frame of signal to obtain smoothed energy of the last acquired frame of signal; and determining the smoothed energy of the last acquired frame of signal as the noise energy.

According to one or a plurality of embodiments of the present disclosure, example 4 provides the method of example 1, further including: performing smoothing processing on signal energy of previous N frames of signal in the noise signal to obtain smoothed energy of the previous N frames of signal; where the previous N frames of signal are N frames of signal before the last acquired frame of signal in the noise signal, and N is a positive integer greater than or equal to 1; performing smoothing processing on signal energy of the last acquired frame of signal based on the smoothed energy of the previous N frames of signal and the signal energy of the last acquired frame of signal to obtain smoothed energy of the last acquired frame of signal; comparing the smoothed energy of the last acquired frame of signal with previously updated noise energy; and updating the previously updated noise energy based on a comparison result to obtain updated noise energy.

According to one or a plurality of embodiments of the present disclosure, example 5 provides the method of example 1, further including: in a case that the smoothed energy of the last acquired frame of signal is less than the previously updated noise energy, updating the previously updated noise energy by the following formula:

$$N_{updated\ noise\ energy} = (a * E\_\text{smoothed}(t) + b * N_{previously\ updated\ noise\ energy}) * c$$

in a case that the smoothed energy of the last acquired frame of signal is greater than the previously updated noise energy, updating the previously updated noise energy by the following formula:

$$N_{updated\ noise\ energy} = N_{previously\ updated\ noise\ energy} * d$$

where $N_{updated\ noise\ energy}$ represents the updated noise energy; $E\_\text{smoothed}(t)$ represents the smoothed energy of the last acquired frame of signal; $N_{previously\ updated\ noise\ energy}$ represents the previously updated noise energy; a, b, c, and d are coefficients; and t represents time.

According to one or a plurality of embodiments of the present disclosure, example 6 provides the method of example 1, further including: determining target volume corresponding to the noise energy by using a preset correspondence table; and determining the playback volume of the audio or the video based on the target volume.

According to one or a plurality of embodiments of the present disclosure, example 7 provides the method of example 1, further including: calculating target volume corresponding to the noise energy by using a preset functional relationship, where the target volume and the noise energy satisfy the preset functional relationship; and determining the playback volume of the audio or the video based on the target volume.

According to one or a plurality of embodiments of the present disclosure, example 8 provides the method of example 1, further including: acquiring the noise signal outside the terminal during an interval of switching the audio or the video.

The above description is merely intended for preferred embodiments of the present disclosure and an illustration of the applied technical principles. Those skilled in the art should understand that, the disclosure scope involved in the present disclosure is not limited to the technical solutions formed by a specific combination of the above technical features, but also should cover other technical solutions formed by an arbitrary combination of the above technical features or their equivalent features without departing from the above disclosure concept, for example, a technical solution formed by a replacement of the above features with technical features with similar functions disclosed (but not limited to) in the present disclosure.

In addition, although respective operations are described in a specific order, this should not be interpreted as requiring these operations to be performed in the specific order shown or in a sequential order. Under certain circumstances, multitasking and parallel processing may be advantageous. Similarly, although several specific implementation details are included in the above discussion, these should not be interpreted as limiting the scope of the present disclosure. Certain features described in the context of a single embodiment may also be implemented in combination in the single embodiment. Conversely, various features described in the context of a single embodiment may also be implemented in multiple embodiments individually or in any suitable subcombination.

Although the subject matter has been described in language specific to structural features and/or method logical actions, it should be understood that the subject matter defined in the appended claims is not limited to the specific features or actions described above. On the contrary, the specific features and actions described above are only example forms for implementing the claims. Regarding the apparatus in the above-mentioned embodiments, the specific methods of performing operations by respective modules have been described in detail in the embodiments related to the methods, which will not be described in detail here.

What is claimed is:

1. An automatic volume adjustment method, comprising:
   in a case that a preset action by a user for audio or video being played on a terminal is detected, determining that the terminal is in an interval of audio or video switching currently, wherein the interval of audio or video switching is a duration during which the terminal does not output loudspeaker sound;
   acquiring a noise signal outside the terminal during the interval of audio or video switching;
   determining noise energy based on the noise signal; and
   adjusting playback volume of audio or video on the terminal based on the noise energy;
   wherein the determining the noise energy based on the noise signal comprises:
      performing smoothing processing on signal energy of previous N frames of signal in the noise signal to obtain smoothed energy of the previous N frames of signal; wherein the previous N frames of signal are N frames of signal before a last acquired frame of signal in the noise signal, and N is a positive integer greater than or equal to 1;
      performing smoothing processing on signal energy of the last acquired frame of signal based on the smoothed energy of the previous N frames of signal and the signal energy of the last acquired frame of signal, to obtain smoothed energy of the last acquired frame of signal;
      determining the smoothed energy of the last acquired frame of signal as the noise energy; or,
   comparing the smoothed energy of the last acquired frame of signal with previously updated noise energy, and updating the previously updated noise energy based on a comparison result to obtain updated noise energy.

2. The method according to claim 1, wherein the updating the previously updated noise energy based on the comparison result comprises:
   in a case that the smoothed energy of the last acquired frame of signal is less than the previously updated noise energy, updating the previously updated noise energy by the following formula:

$$N_{updated\ noise\ energy} = (a * E\_smoothed(t) + b * N_{previously\ updated\ noise\ energy}) * c$$

in a case that the smoothed energy of the last acquired frame of signal is greater than the previously updated noise energy, updating the previously updated noise energy by the following formula:

$$N_{updated\ noise\ energy} = N_{previously\ updated\ noise\ energy} * d$$

wherein N updated noise energy represents the updated noise energy; $E\_smoothed(t)$ represents the smoothed energy of the last acquired frame of signal; $N_{previously\ updated\ noise\ energy}$ represents the previously updated noise energy; a, b, c, and d are coefficients; and t represents time.

3. The method according to claim 1, wherein the adjusting the playback volume of the audio or the video on the terminal based on the noise energy comprises:
   determining target volume corresponding to the noise energy by using a preset correspondence table; and
   determining the playback volume of the audio or the video based on the target volume.

4. The method according to claim 1, wherein the adjusting the playback volume of the audio or the video on the terminal based on the noise energy comprises:
   calculating target volume corresponding to the noise energy by using a preset functional relationship, wherein the target volume and the noise energy satisfy the preset functional relationship; and
   determining the playback volume of the audio or the video based on the target volume.

5. An automatic volume adjustment apparatus, comprising:
   at least one processor; and
   a memory;
   wherein the memory stores computer instructions; and the processor is configured to call and run the computer instructions stored in the memory to:
      in a case that a preset action by a user for audio or video being played on a terminal is detected, determine that the terminal is in an interval of audio or video switching currently, wherein the interval of audio or video switching is a duration during which the terminal does not output loudspeaker sound;

acquire a noise signal outside the terminal during the interval of audio or video switching;

determine noise energy based on the noise signal;

adjust playback volume of audio or video based on the noise energy;

perform smoothing processing on signal energy of previous N frames of signal in the noise signal to obtain smoothed energy of the previous N frames of signal; wherein the previous N frames of signal are N frames of signal before a last acquired frame of signal in the noise signal, and N is a positive integer greater than or equal to 1;

perform smoothing processing on signal energy of the last acquired frame of signal based on the smoothed energy of the previous N frames of signal and the signal energy of the last acquired frame of signal, to obtain smoothed energy of the last acquired frame of signal;

determine the smoothed energy of the last acquired frame of signal as the noise energy; or, compare the smoothed energy of the last acquired frame of signal with previously updated noise energy, and update the previously updated noise energy based on a comparison result to obtain updated noise energy.

6. The apparatus according to claim 5, wherein the processor is configured to call and run the computer instructions stored in the memory to:

in a case that the smoothed energy of the last acquired frame of signal is less than the previously updated noise energy, update the previously updated noise energy by the following formula:

$$N_{updated\ noise\ energy} = (a * E\_smoothed(t) + b * N_{previously\ updated\ noise\ energy}) * c$$

in a case that the smoothed energy of the last acquired frame of signal is greater than the previously updated noise energy, update the previously updated noise energy by the following formula:

$$N_{updated\ noise\ energy} = N_{previously\ updated\ noise\ energy} * d$$

wherein N updated noise energy represents the updated noise energy; E_smoothed(t) represents the smoothed energy of the last acquired frame of signal; $N_{previously\ updated\ noise\ energy}$ represents the previously updated noise energy; a, b, c, and d are coefficients; and t represents time.

7. The apparatus according to claim 5, wherein the processor is configured to call and run the computer instructions stored in the memory to:

determine target volume corresponding to the noise energy by using a preset correspondence table; and determine the playback volume of the audio or the video based on the target volume.

8. The apparatus according to claim 5, wherein the processor is configured to call and run the computer instructions stored in the memory to:

calculate target volume corresponding to the noise energy by using a preset functional relationship, wherein the target volume and the noise energy satisfy the preset functional relationship; and determine the playback volume of the audio or the video based on the target volume.

9. A non-transitory computer-readable medium, on which a computer program is stored, wherein when the computer program is executed by a processor, the processor is caused to:

in a case that a preset action by a user for audio or video being played on a terminal is detected, determine that the terminal is in an interval of audio or video switching currently, wherein the interval of audio or video switching is a duration during which the terminal does not output loudspeaker sound;

acquire a noise signal outside the terminal during the interval of audio or video switching;

determine noise energy based on the noise signal; and adjust playback volume of audio or video based on the noise energy;

perform smoothing processing on signal energy of previous N frames of signal in the noise signal to obtain smoothed energy of the previous N frames of signal; wherein the previous N frames of signal are N frames of signal before a last acquired frame of signal in the noise signal, and N is a positive integer greater than or equal to 1;

perform smoothing processing on signal energy of the last acquired frame of signal based on the smoothed energy of the previous N frames of signal and the signal energy of the last acquired frame of signal, to obtain smoothed energy of the last acquired frame of signal;

determine the smoothed energy of the last acquired frame of signal as the noise energy; or, compare the smoothed energy of the last acquired frame of signal with previously updated noise energy, and update the previously updated noise energy based on a comparison result to obtain updated noise energy.

\* \* \* \* \*